(12) United States Patent
Ichino et al.

(10) Patent No.: US 8,472,488 B2
(45) Date of Patent: Jun. 25, 2013

(54) ALGORITHM TO DRIVE SEMICONDUCTOR LASER DIODE

(75) Inventors: Moriyasu Ichino, Yokohama (JP); Tadashi Sakai, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/528,702

(22) Filed: Jun. 20, 2012

(65) Prior Publication Data

US 2012/0327964 A1 Dec. 27, 2012

(30) Foreign Application Priority Data

Jun. 24, 2011 (JP) ................................ 2011-140592

(51) Int. Cl.
*H01S 3/10* (2006.01)
*H01S 3/13* (2006.01)
*H01S 3/00* (2006.01)

(52) U.S. Cl.
USPC ..................... 372/26; 372/29.015; 372/38.02; 372/38.07

(58) Field of Classification Search
USPC .......................... 372/26, 29.015, 38.02, 38.07
See application file for complete search history.

(56) References Cited

U.S. PATENT DOCUMENTS 7,715,728 B2 5/2010 Kijima et al.

FOREIGN PATENT DOCUMENTS

JP 2007-324525 A 12/2007

*Primary Examiner* — Armando Rodriguez
(74) *Attorney, Agent, or Firm* — Venable LLP; Michael A. Sartori; Tamatane J. Aga

(57) ABSTRACT

An algorithm to drive a semiconductor laser diode (LD) is disclosed. The algorithm assumes that the modulation current to keep the extinction ratio in constant has temperature dependence represented by an exponential function under the average output power of the LD is kept constant by an auto-power-control (APC). When a tracking error exists and the approximation by an exponential function is turned out in failure, the algorithm adds a correction to the exponential function determined by a difference between a practically measured modulation current and another modulation current calculated from a value determined for a bared LD.

6 Claims, 4 Drawing Sheets

ALGORITHM TO DRIVE SEMICONDUCTOR LASER DIODE

BACKGROUND OF THE INVENTION

1. Field of the Invention

The present invention relates to an algorithm or method to drive semiconductor laser diode.

2. Related Background Art

An optical module applicable to the optical communication system generally installs a semiconductor laser diode (hereafter denoted as LD) for a light-emitting device. An LD generally shows large temperature dependence in characteristics thereof, such as the threshold current, the slope efficiency and so on. Various prior arts have disclosed to compensate the temperature dependence of an LD to make the average output power and the extinction ratio ER independent of the temperature.

SUMMARY OF THE INVENTION

One aspect of the present invention relates to an algorithm to drive a semiconductor laser diode (LD) enclosed in an optical subassembly. The LD may emit light with the average power dependent on the bias current $I_{bias}$ and the extinction ratio dependent on the modulation current $I_{mod}$. The algorithm includes steps of: (a) determining at least three modulation currents under respective temperature different from others, where the determination is carried out under a condition that the average power is kept constant independent of the temperature in a preset value by controlling the bias current, where each of the modulation currents may set the extinction ration in another preset value independent of the temperature; (b) relating these three modulation currents with the temperature by an exponential function; and (c) determining a modulation current at an optional temperature by the exponential function.

Because the modulation current to set the extinction ratio of the light emitted from the LD in a preset value independent of the temperature is related to the temperature by the exponential function, and this exponential function may be determined by at least three modulation currents measured beforehand at respective temperatures, the extinction ratio of the light at an optional temperature may be stably set in the preset value.

When the optical module that installs an optical subassembly (OSA) implemented with an LD has the tracking error, the method according to an embodiment of the invention may collect the modulation current practically supplied to the LD precisely. Specifically, the exponential function relating the modulation current with the temperature is estimated by the bared OSA before the OSA is installed within the optical module. After the installation of the OSA into the optical module, the modulation current to set the extinction ratio of the light emitted from the optical module is practically measured for the optical module. The discrepancy between the modulation currents at an optional temperature may be corrected by a linear approximation of the difference between the modulation currents, one is measured in the bared OSA and the other is measured for the optical module. Thus, even the tracking error exists in the optical module; the extinction ratio of the light output from the optical module may be set in the preset value.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments according to the present invention will be described in detail as referring to drawings. In the description of the drawings, the numerals or symbols same or similar to each other will refer to the elements same or similar to each other without overlapping explanations.

First Embodiment

Figure 1:
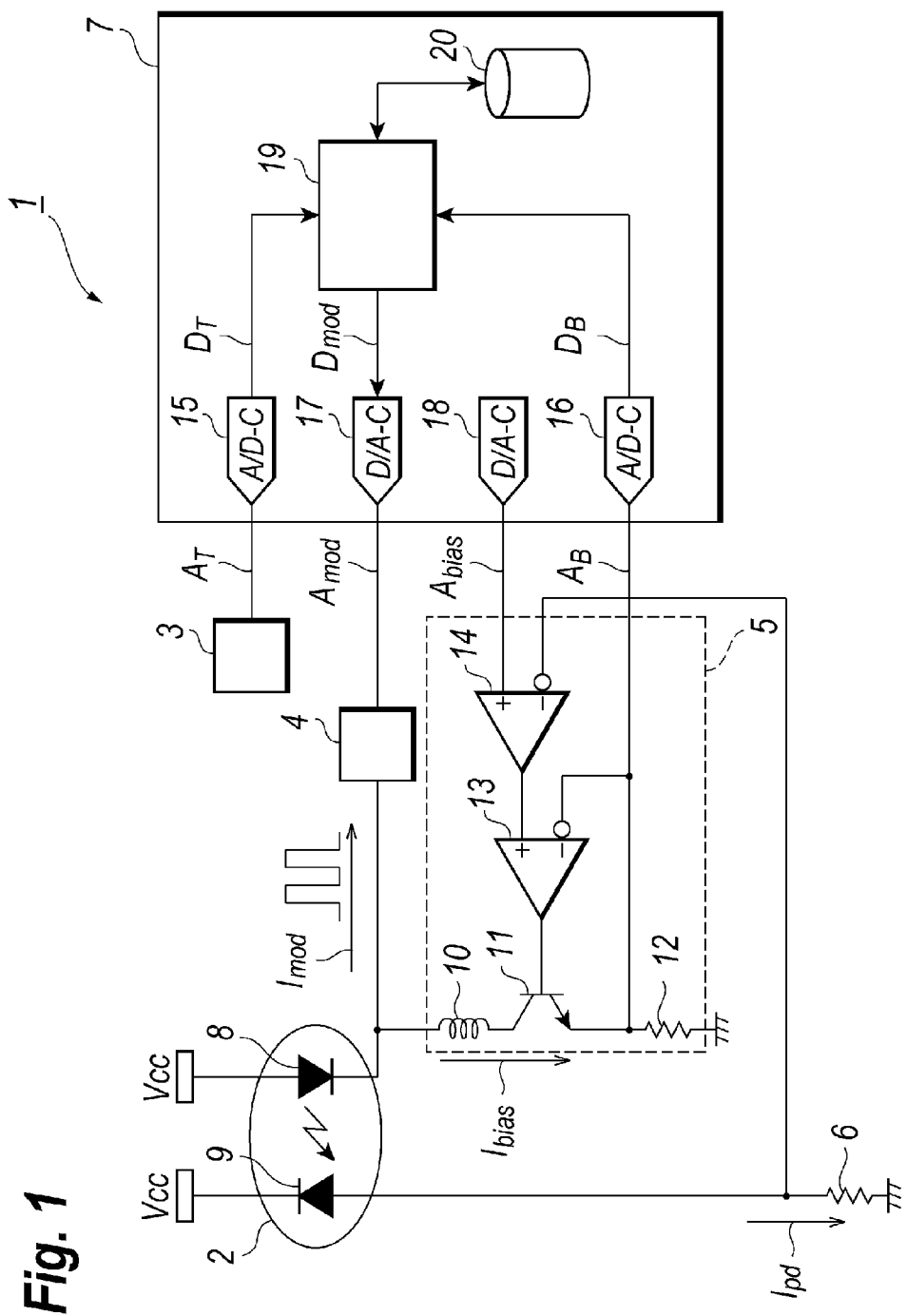
FIG. 1 is a functional block diagram of an optical module according to an embodiment of the invention.

FIG. 1 shows a functional block diagram of an optical module 1 implemented with an LD driven by an algorithm or method according to the first embodiment of the invention. The optical module 1 may transmit signal light and includes an optical subassembly (hereafter denoted as OSA), a temperature sensor 3, an LD driver 4, an auto-power control (APC) 5, a sensing resistor 6, and a controller 7. The OSA 2 installs an LD 8 and a photodiode (hereafter denoted as PD) 8 to monitor a portion of light emitted from the LD 8. The LD implemented therewith is a type of, what is called, the edge-emitting LD with a front facet and a back facet. Light emitted from the front facet of the LD couples with an external fiber to transmit therethrough; while, a portion of light is emitted from the back facet of the LD 8 and this portion of light may be monitored by the PD 9 to generate a photocurrent $I_{pd}$ in the anode thereof. The anode of the LD 8 and the cathode of the PD 9 are commonly biased by a power supply Vcc.

The LD driver 4 coupled with the cathode of the LD 8 may drive the LD 8 by providing a modulation current $I_{mod}$ thereto. The modulation current, which swings between two levels each corresponding to the logical "1" and "0". The LD driver 4 may adjust a width of these two levels, which will be described layer as the extinction ratio of the optical output from the LD 8.

The APC 5 includes an inductor 10, a transistor 11, a resistor 12, and two amplifiers, 13 and 14, to constitute an APC loop, by which the bias current $I_{bias}$ supplied to the LD 8 is controlled to keep an average output of the LD in constant. The transistor 11 is coupled with the cathode of the LD 8 in the collector thereof via the inductor 10, receives an output of the first amplifier 13 in the base, and grounded in the emitter thereof via the resistor 12. The emitter of the transistor 11 is also coupled with the inverting input of the amplifier 13 to constitute a current source. The second amplifier 14 senses in the inverting input thereof the photocurrent Ipd via the sensing resistor 6, which is converted into a voltage signal, and compares thus converted voltage signal with a reference $A_{bias}$ provided from the controller 7 via the digital-to-analog converter (hereafter denoted as D/A-C) 18 to output a signal corresponding to a difference between the photocurrent Ipd and the reference $A_{bias}$ to the first amplifier. The first amplifier 13 combined with the transistor 11 generates a current corresponding to this difference. When the photocurrent Ipd exceeds the reference $A_{bias}$, a bias current $I_{bias}$ currently supplied to the LD 8 is decreased, while, the photocurrent Ipd in a voltage form thereof is less than the reference $A_{bias}$, the amplifier 13 combined with the transistor 11 increases the bias current $I_{bias}$. Thus, the APC 8 adjusts the bias current to keep the average output of the LD 8 in constant.

The controller 7 includes two analog-to-digital converters (hereafter denoted as A/D-C), 15 and 16, two D/A-Cs, 17 and 18, a processing unit, and a memory 20. The first A/D-C converts a signal $A_T$ provided from a temperature sensor 3, where the signal $A_T$ that corresponds to the current ambient temperature T into a digital signal $D_T$. The second A/D-C 16 may convert another analog signal $A_B$ into a digital form $D_B$, which represents the bias current $I_{bias}$ currently provided to the LD 8. The first D/A-C 17 sets the amplitude of the modulation current $A_{mod}$, which corresponds to a difference of two levels contained in the modulation signal externally provided to the optical module 1; while, the second A/D-C 18 defines the reference $A_{bias}$ of the APC 5.

The processing unit 19 in the controller 7, referring to signals $D_T$ and $D_B$, where the former corresponds to a current temperature, while the latter represents the magnitude of the bias current $I_{bias}$ currently provided to the LD 8 under the operation of the APC 5, reads one of values $D_{MOD}$ stored in the memory to define the magnitude of the modulation current and provide this parameter to the LD driver 4 as an analog form $A_{mod}$ via the second D/A-C 17. The memory 20 stores a plurality of values $D_T$ each corresponding to temperatures.

Figure 2:
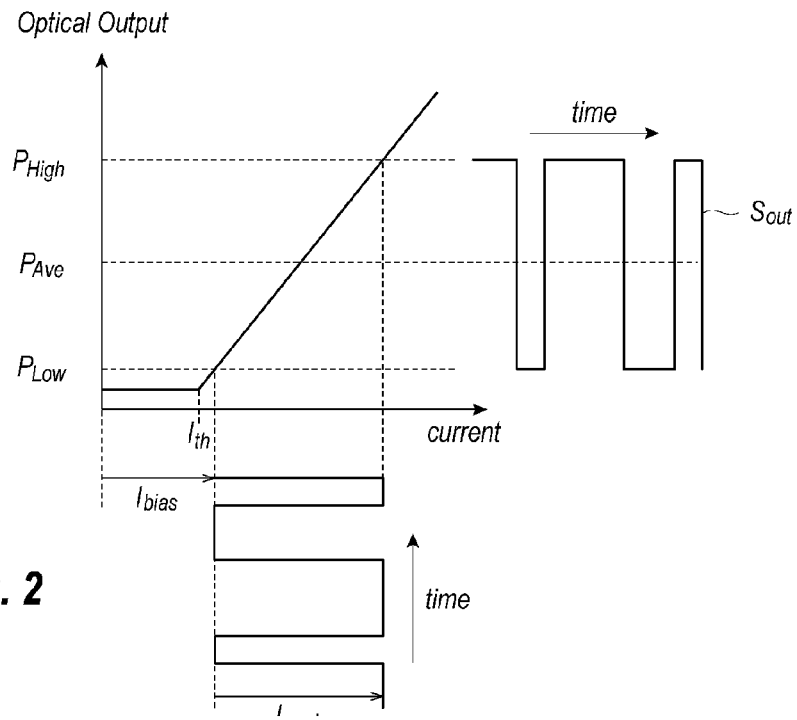
FIG. 2 schematically illustrates a bias current $I_{bias}$ and a modulation current $I_{mod}$ provided to an LD shown in FIG. 1.

FIG. 2 schematically shows a relation of the bias current $I_{bias}$ to the modulation current $I_{mod}$. Supplying the modulation current $I_{mod}$ in addition to the bias current $I_{bias}$ to the LD 8, the LD 8 may emit signal light $S_{OUT}$ with two optical levels, $P_{HIGH}$ and $P_{LOW}$, alternately swinging as the time going. The optical module 1 of the embodiment may keep the average level $P_{AVE}$ constant in a preset value by the APC 5, while, the extinction ratio ER, which is defined by an equation of $ER=10\times\log(P_{HIGH}/P_{LOW})$, constant in another value by the controller 7.

An algorithm to drive the LD 8 according to an embodiment of the invention will be described. First, the bias current $I_{bias}$ to get a target average output from the LD 8 is supplied thereto by activating the APC 5 at a room temperature $T^{(RT)}$. Under such a condition, the controller 7 may determine the $D_{MOD}$ to obtain the target extinction ratio ER at the room temperature $T^{(RT)}$. The same procedures to determine the modulation current to get the target extinction ratio ER are performed in a high temperature $T^{(High)}$ and a low temperature $T^{(Low)}$. Thus, the first step may determine three values of $D_{MOD}^{(RT)}$, $D_{MOD}^{(High)}$, and $D_{MOD}^{(Low)}$ for the modulation current $I_{mod}$, and stores these values in the memory 20.

Figure 3:
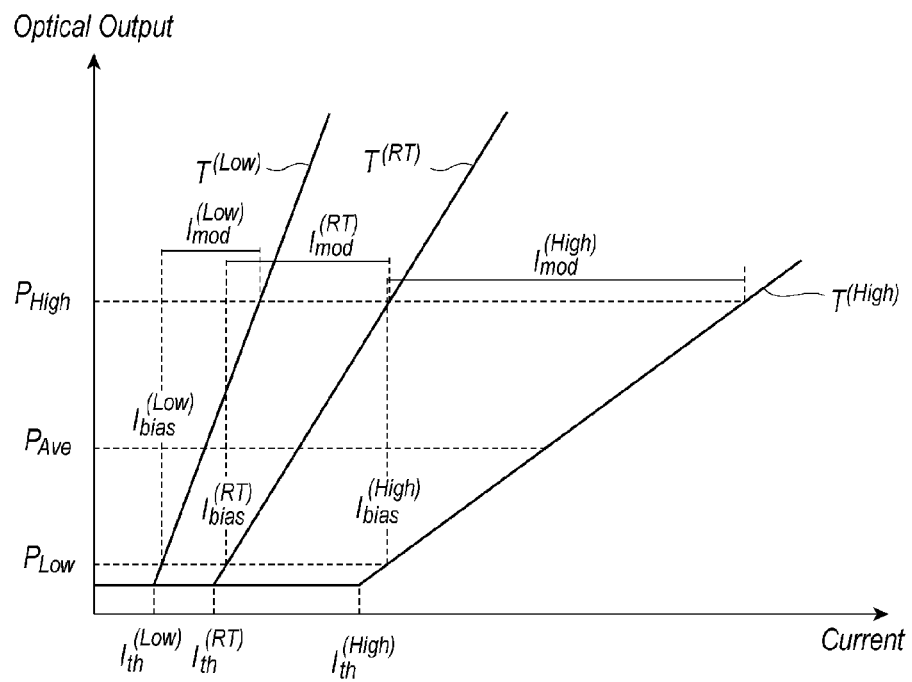
FIG. 3 schematically illustrates a current to optical output characteristics (I-L characteristic) of an LD.

FIG. 3 schematically illustrates the current-optical characteristics, which is generally called as I-L characteristic, of an LD under various temperatures. The I-L characteristic of an LD roughly depicted by two lines, one of which corresponds to a region where the current is less than the threshold current $I_{th}$ and the LD causes no coherent light; while, the other corresponds to a region next to the former line, in which the optical power output from the LD linearly increases as the current supplied thereto increases and the LD emit coherent, or laser light. The threshold current $I_{th}$ is a current dividing these two regions. As shown in FIG. 3, the threshold current $I_{th}$ has temperature dependence, that is, the threshold current $I_{th}$ increases as the temperature increases. Generally, the threshold current $I_{th}$ may be expressed as:

$$I_{th\_}=I_0\times\exp(T/T_0),$$

where $I_0$ and $T_0$ are constants but vary in respective LDs. Moreover, the slope of the second line, namely, in a region greater than the threshold current $I_{th}$, which is generally called as the slope efficiency and denoted by shows an inverse relation against the temperature. The slope efficiency η decreases as the temperature increases. Accordingly, when the APC adjusts the bias current $I_{bias}$ to keep the average output power from the LD constant in a preset value, the modulation current $I_{mod}$ which roughly has an inverse relation to the slope efficiency η is necessary to be increased to keep the extinction ratio ER in constant.

When an LD is thus controlled in the bias current $I_{bias}$ and the modulation current $I_{mod}$ to keep the average output power and the extinction ratio ER in constant, the modulation current $I_{mod}$ is necessary to be increased as the temperature increases. As shown in FIGS. 2 and 3, when the APC 5 adjusts the bias current $I_{bias}$ to keep the average output power in constant, and the modulation current $I_{mod}$ is, under such an APC operation, adjusted to keep the extinction ratio ER independent of the temperature; instantaneous operating points of the LD in the I-L characteristic are always on the second line attributed with the slope efficiency η. Under those conditions, the modulation current $I_{mod}$ may be represented by the exponential function, that is, the modulation current $I_{mod}$ increases exponentially against the temperature as follows:

$$I_{mod}=a\times\exp(b\times T)+c. \qquad (1)$$

Step 1 of the algorithm above described evaluates the modulation current $I_{mod}$ and the bias current $I_{bias}$ to keep the average output power and the extinction ratio independent of the temperature at three temperatures, $T^{(RT)}$, $T^{(High)}$, and $T^{(Low)}$. Then, the parameters, a to c, appeared in equation (1) may be determined.

In the practical operation of the LD at a temperature, the algorithm according to an embodiment next activates the APC 5 at the temperature T to set the average output power in the preset value. Then, the controller 7 reads parameters, a to c, in equation 1 from the memory, and the processing unit 19 calculates the value $D_{mod}$ to be set in the first D/A-C 17 according to equation (1) by the parameters, a to c, and the current temperature T which is read from the temperature sensor 3 via the first A/D-C 15. Finally, the processing unit 19 may transfer the parameter $D_{MOD}$ thus calculated to the LD driver 4 via the first D/A-C 17. In a modification, the controller may calculate a plurality of values $D_{MOD}$ each corresponding to temperatures using thus determined parameters, a to c; and stores these values $D_{MOD}$ in the memory as a look-up-table (LUT) in advance to the practical operation of the LD 8. Then, the controller 7 in the practical operation receives the current temperature T and reads from the LUT in the memory one of values $D_{MOD}$ as a most likely value whose corresponding temperature closest to the current temperature T, or at least two values whose corresponding temperatures put the current temperature therebetween and calculates a value $D_{MOD}$ to be set in the LD driver 4 by, for instance, the interpolation using thus read values.

The algorithm to drive the LD 8 according to an embodiment first evaluates the modulation current $I_{mod}$ to set the extinction ratio ER constant in a preset value by activating the APC 5 to set the average output power in a preset value at three temperatures, $T^{(RT)}$, $T^{(High)}$, and $T^{(Low)}$. At an optional temperature except for those three temperatures, the algorithm may calculate the modulation current $I_{mod}$ assuming that the temperature dependence of the modulation current to keep the extinction ratio in the preset value exponentially depends on the ambient temperature of the LD 8. Accordingly, the LD 8 may be operable in the condition where the average output power and the extinction ratio are kept in respective preset value.

Figure 4:
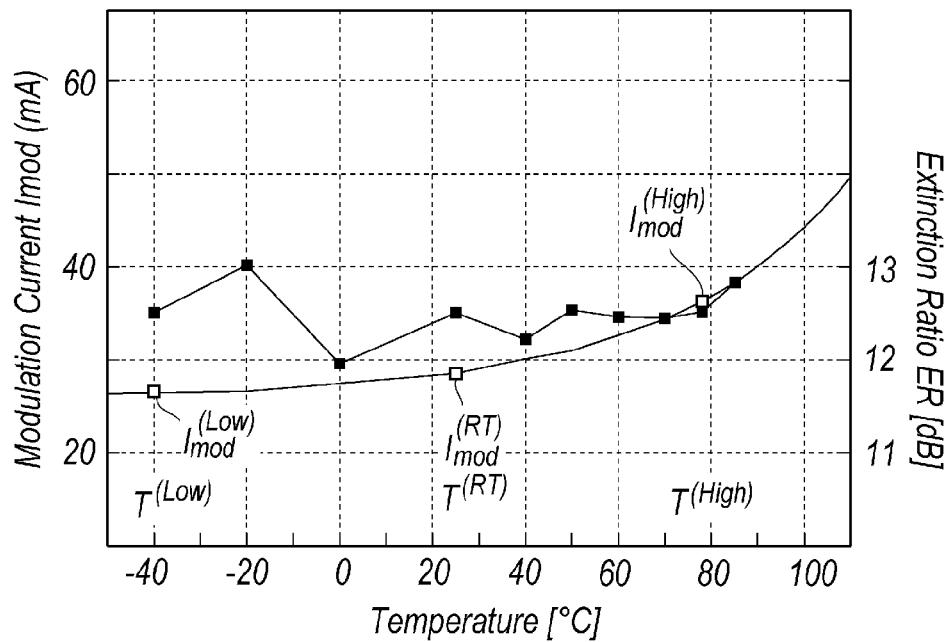
FIG. 4 shows a behavior of the modulation current against the temperature, which is determined by an algorithm of the first embodiment, and the extinction ratio derived from thus determined modulation current.

FIG. 4 shows behaviors of the modulation current $I_{mod}$ and the extinction ratio ER determined by the algorithm of the embodiment to keep them in respective preset values independent of the temperature. As shown in FIG. 4, the modulation current $I_{mod}$ at optional temperatures except for three temperatures, $T^{(RT)}$ (25° C.), $T^{(High)}$ (78° C.), and $T^{(Low)}$ (−40° C.), may be determined based on the three values $I_{mod}^{(RT)}$, $I_{mod}^{(High)}$, $I_{mod}^{(Low)}$, and the assumption that they exponentially depends on the temperature; then, the extinction ratio ER derived from thus set modulation current $I_{mod}$ becomes around 12.5 dB and substantially independent of the temperature.

Figure 5:
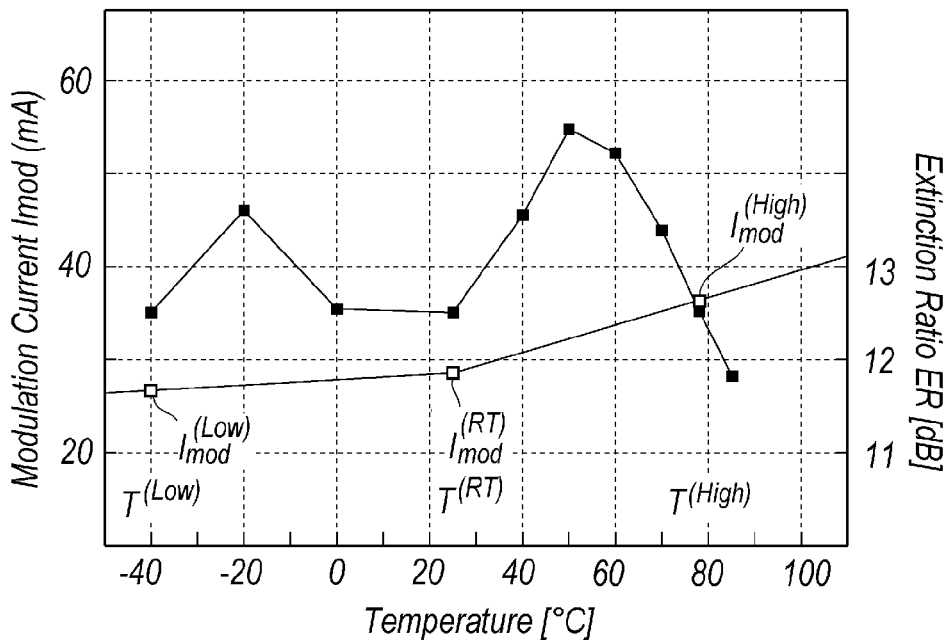
FIG. 5 shows a behavior of the modulation current against the temperature determined by a conventional algorithm, and the extinction ratio thereof.

On the other hand, FIG. 5 shows behaviors of the modulation current $I_{mod}$ and the extinction ratio ER against temperatures, where the modulation current $I_{mod}$ in optional temperatures except for three points, $T^{(RT)}$, $T^{(High)}$, and $T^{(Low)}$, are calculated by the assumption that it linearly depends on the temperature. That is, the modulation current $I_{mod}$ at a temperature is calculated by the linear interpolation of two measured values putting the current temperature therebetween. The extinction ratio ER resultantly obtained widely scatters apart from the target value of 12.5 dB.

Second Embodiment

Next, an algorithm to drive an LD according to another embodiment of the invention will be described. The second algorithm takes, what is called, the tracking error into account. The arrangement of the optical module is same as those shown and described in FIG. 1.

A practical optical module 1 inherently accompanies with the tracking error even the average output power of the LD 8 is controlled by the APC 5. One reason of the tracking error is the physical arrangement of the module 1, namely, the temperature dependence of the optical coupling efficiency for the light emitted from the LD 8 and enters an external fiber. Optical coupling efficiency between optical components installed between the LD 8 and the fiber, such as a lens, causes a positional deviation depending on the ambient temperature, which degrades the optical coupling efficiency therebetween, and the optical power output from the optical module 1. The other reason is the temperature dependence of the power ratio of the back facet light of the LD 8 to the front facet light. The light output from the front face of the LD 8 is output from the optical module 1, while, the light output from the back facet of the LD 8 is used in the APC 5. In other words, the APC 5 may keep the average optical power output from the back facet of the LD 8. Accordingly, even when the APC 5 can maintain the output power constant in the preset value, the practical power output from the optical module 1 is not always kept constant in the preset value. When the ratio of the optical power output from the front facet of the LD 8 to that from the back facet thereof has temperature dependence, the optical power output from the optical module varies as the temperature varies.

The cause for the first reason may be removed by, for instance, shortening the optical path length from the LD 8 to the optical fiber and/or omitting the optical components. Moreover, even when the optical power output from the optical module changes, the practical optical power output from the LD 8 is kept constant by the APC 5, then, the extinction ratio ER may be constant according to the algorithm above described.

However, the second cause cannot be removed, because the optical power output from the LD 8 changes as the temperature varies. It results in a large offset from the exponential function, or the modulation current at a low temperature $I_{mod}^{(Low)}$ sometimes becomes larger than that in the room temperature $I_{mod}^{(RT)}$ in an excessive condition, which negates the assumption that the temperature dependence of the modulation current may be expressed by an exponential function. The approximation by an exponential function assumes that the average optical power is kept constant and the operation of the LD 8 is always performed on the second line determining the slope efficiency η in any moments.

Figure 6:
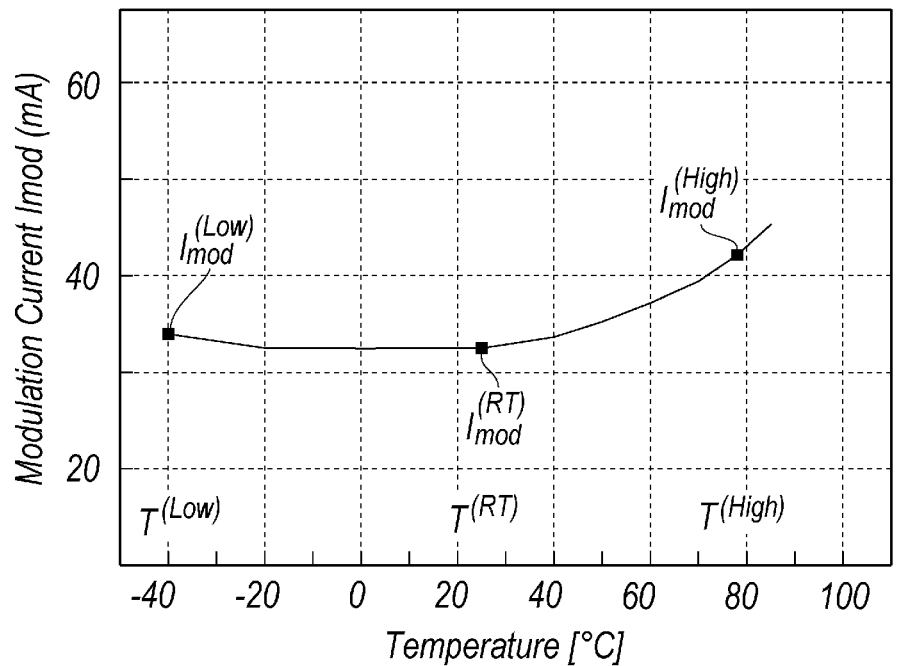
FIG. 6 shows a behavior of the modulation current against the temperature when a tracking error exists around the LD.

FIG. 6 shows a behavior of the modulation current $I_{mod}$ to keep the extinction ratio ER constant in a preset value when the tracking error exists in the LD 8. As shown in FIG. 6, the modulation current at a low temperature $I_{mod}^{(Low)}$ becomes larger than that in a room temperature $I_{mod}^{(RT)}$. Assuming a condition that a ratio of the back facet light to the front facet light is 10% at the room temperature and further assuming that it decreases to 9% at a low temperature, the front fact light at the low temperature becomes 91%. Because the APC 5 continues to control the bias current $I_{bias}$ to keep the average optical output in the preset value even at the low temperature, the front facet light increases by about 10/9=1.11 (11%) at the low temperature.

Accordingly, when the tracking error caused by the temperature dependence of the power ratio of the back facet light to the front facet light exists, the change of the average output power at the low temperature becomes only around 0.4 dB but that of the extinction ratio ER shows greater discrepancy. For instance, the extinction ratio ER at a room temperature is about 10 dB, the extinction ratio at the low temperature becomes 8.2 dB set by the modulation current $I_{mod}$ under the consumption that the average output power is kept constant even at the low temperature, which means that the change of the extinction ratio becomes 1.8 dB. In order to set the extinction ratio ER constant in the preset value even at the low temperature, the modulation current $I_{mod}$ is necessary to be increased by 11%. In such a case, the modulation current thus determined often exceeds that in the room temperature, and the assumption that the temperature dependence of the modulation current $I_{mod}$ is expressed by an exponential function turns out in failure.

The algorithm to drive an LD according to the second embodiment of the invention is carried out as follows:

The algorithm first measures the front facet light. Specifically, the algorithm prepares a bared OSA 2 independent of the optical module 1, where the OSA only installs an LD 8 and the monitoring PD 2 as shown in FIG. 1. The bared OSA 2 means that the OSA is not installed within the optical module 1. Supplying a current I for the LD 8 to emit light with power $P_{AVE}$, the optical output power practically measured. Then, based on the current I and the threshold current at temperatures, $I_{th}^{(RT)}$, $I_{th}^{(Low)}$, and $I_{th}^{(High)}$, where they are measure in advance to the operation of the OSA 2, or provided from a vendor of the OSA 2, the I-L characteristic of the OSA 2 is estimated. That is, the modulation current $I_m$ may be estimated by an equation $I_m^{(T)} = I - I_{th}^{(T)}$, and the slope efficiency $\eta^{(T)}$ may be calculated by an equation of $\eta^{(T)} = P_{AVE}/I_m^{(T)}$, then the slope efficiency at respective temperatures, $\eta^{(RT)}$, $\eta^{(Low)}$, and $\eta^{(High)}$, are calculated. These calculations are done only for the bared OSA 2 before it is installed in the optical module 1 as a first step.

Then, installing the OSA 2 within the optical module 1 and activating the APC 5 to provide the bias current $I_{bias}$ to get an average optical power from the LD 8, the algorithm measures the modulation current $I_{mod}^{(RT)}$, by which the preset extinction ratio ER is obtained, by adjusting the parameter $D_{mod}$ at the room temperature. In a case that the preset extinction ratio ER is large enough, the bias current $I_{bias}$ may be regarded as the threshold current $I_{th}$ and the modulation current $I_{mod}^{(RT)}$ thus measured may be also regarded as the current $I_m$ measured in the bared OSA 2. Because the modulation current depends on the slope efficiency and the average output power is independent of the temperature assuming that no tracking error exists, the modulation current at the low temperature $I_{mod}^{(Low)}$ and that $I_{mod}^{(High)}$ may be estimated by:

$$I_{mod}^{(Low)} = I_{mod}^{(RT)} \times \eta^{(RT)}/\eta^{(Low)}, \text{ and} \quad (2)$$

$$I_{mod}^{(High)} = I_{mod}^{(RT)} \times \eta^{(RT)}/\eta^{(High)}. \quad (3)$$

Parameters, a to c, appearing in equation (1) may be calculated by these three modulation currents, $I_{mod}^{(RT)}$, $I_{mod}^{(Low)}$ and $I_{mod}^{(High)}$. The second algorithm may store these three parameters, a to c, and three modulation currents, $I_{mod}^{(RT)}$, $I_{mod}^{(Low)}$ and $I_{mod}^{(High)}$, in the memory 20 as the LUT.

Then, as the OSA 2 is set within the optical module 1, operating the APC 5 to keep the average output power constant in the preset value, and setting the ambient temperature of the optical module in the high temperature $T^{(High)}$, the modulation current $I_{mod}'^{(High)}$ to get the preset extinction ratio ER and that $I_{mod}'^{(Low)}$ in the low temperature are practically measured.

The algorithm of the embodiment may correct the modulation current provided to the LD 8 at an optional temperature based on the calculated values, $I_{mod}^{(Low)}$ and $I_{mod}^{(High)}$, at the low temperature and the high temperature, respectively, for the bared OSA 2; and the practically measured values, $I_{mod}'^{(Low)}$ and $I_{mod}'^{(High)}$, for the installed OSA 2, where the latter two values are influenced by the tracking error. Specifically, the processing unit 19 calculates the difference between two values, $I_{mod}^{(High)}$ and $I_{mod}'^{(High)}$, at the high temperature, and the difference between them, $I_{mod}^{(Low)}$ and $I_{mod}'^{(Low)}$, at the low temperature, and corrects equation (1) at an optional temperature by the linear interpolation of these differences between the room temperature $T^{(RT)}$ and the high or low temperature, $T^{(High)}$ or $T^{(Low)}$. Then, an equation to estimate the modulation current $I_{mod}$ may be corrected to:

$$I_{mod} = a \times \exp(b \times T) + c + d \times T + e, \quad (4)$$

where parameters, a to e, are constant and latter two, d and e, may be calculated by two differences described above. In the calculation, the difference between two modulation currents, $I_{mod}$ and $I_{mod}'$, disappears at the room temperature $T^{(RT)}$. Moreover, parameters, d and e, are necessary to be doubly evaluated for the high temperature $T^{(High)}$ and for the low temperature $T^{(Low)}$. These parameters, a to d, may be stored in the memory.

The controller 7 may evaluate the modulation current $I_{mod}$ at an optional temperature by receiving the current temperature from the temperature sensor 3 via the firs A/D-C 15, reading the parameters, a to e, and following the equation (4) above. The modulation current $I_{mod}$ thus calculated is set in the LD driver 4 via the first D/A-C 17. Thus, the algorithm according the to second embodiment, the modulation current to keep the extinction ratio constant in the preset value may be uniquely determined even when the modulation current practically measured at the low temperature is larger than that measured at the room temperature and the exponential approximation is unable to be applied, and the practical extinction ratio ER may be kept constant in the preset value.

Figure 7:
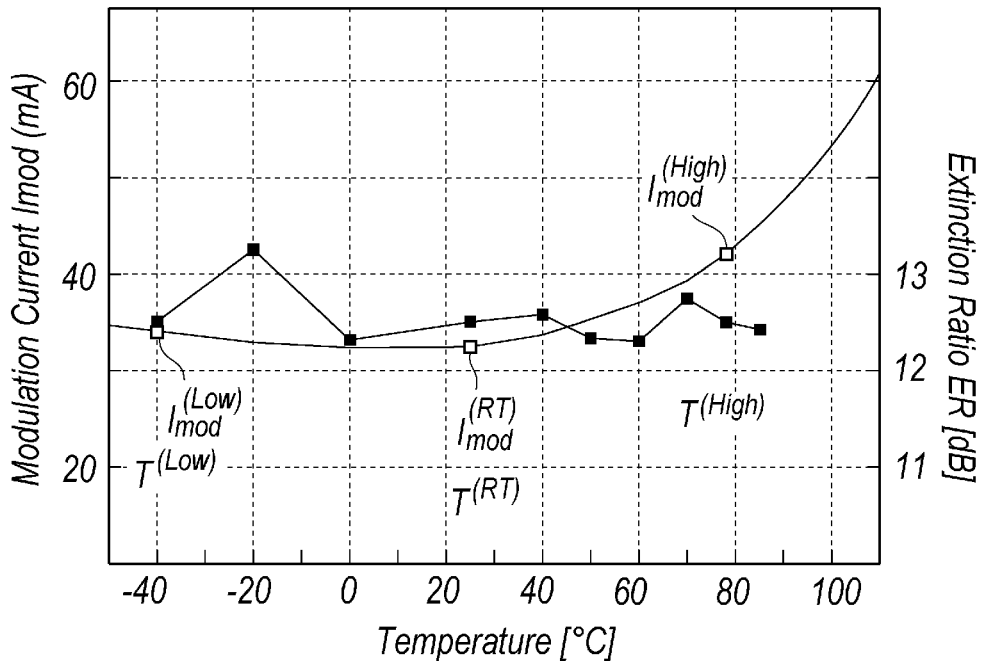
FIG. 7 shows a behavior of the modulation current against the temperature determined by an algorithm according to another embodiment of the invention; and the extinction ratio derived from thus determined modulation current.

FIG. 7 shows the behavior of the modulation current $I_{mod}$ to set the extinction ratio ER within the preset range when the tracking error exist and the modulation current $I_{mod}$ practically measured at the low temperature is larger than that measured at the room temperature. FIG. 7 also shows a behavior of the extinction ratio ER against the temperature resultant from thus corrected modulation current $I_{mod}$. The extinction ratio ER is set within a narrower range around 12.5 dB in a wide range of the temperature.

Thus, according to the algorithm for driving the LD 8, the fundamental parameters of the LD 8 are measured for the OSA 2 before it is installed within the optical module 1, where the fundamental parameters includes the modulation current $I_{mod}$ to get the preset extinction ratio ER at the room temperature $T^{(RT)}$ under the APC 5 is active, and the slope efficiency $\eta$ at three temperatures of $T^{(RT)}$, $T^{(High)}$ and $T^{(Low)}$. The algorithm then calculates the virtual modulation current, $I_{mod}^{(High)}$ and $I_{mod}^{(Low)}$, to get the preset extinction ratio ER at high and low temperatures using these parameters. After the OSA 2 is installed within the optical module 1, the modulation current to get the preset extinction ratio ER is practically measured at two temperatures of $T^{(High)}$ and $T^{(Low)}$, where the modulation currents thus measured are generally different from those measured for the bared OSA 2 because of, for instance, the tracking errors caused by the temperature dependence of the ratio of the optical power for the front facet light to that for the back facet light. Accordingly, the algorithm of the embodiment corrects the difference of the modulation current measured for the bared OSA 2 and that after the installation in the optical module 1 by the linear interpolation between the room temperature $T^{(RT)}$ and the high $T^{(High)}$ or low $T^{(Low)}$ temperature.

In the foregoing detailed description, the method and apparatus of the present invention have been described with reference to specific exemplary embodiments thereof. It will, however, be evident that various modifications and changes may be made thereto without departing from the broader spirit and scope of the present invention. For instance, the second embodiment of the invention prepares three modulation currents at respective temperatures and the correction is carried out in two regions of the temperature. However, more than two modulation currents may be prepared and the correction between the bared status and the installed status of the OSA 2 may be carried out in respective subdivided regions. Thus, the present specification and figures are accordingly to be regarded as illustrative rather than restrictive.

We claim:

1. An algorithm to drive a semiconductor laser diode (LD) enclosed in an optical subassembly, the LD emitting light with an average power dependent on a bias current and an extinction ratio dependent on a modulation current, comprising steps of:

determining three modulation currents at low, room, and high temperatures, each of modulation currents setting the extinction ratio in a preset value independent of the temperatures, where the determination is carried out under a condition that the average power is kept constant independent of the temperature in another preset value by controlling the bias current;

estimating an exponential function that relates the three modulation currents with the low, room, and high temperatures; and determining a modulation current at an operating temperature different from the low, room, and high temperatures by the exponential function.

2. The algorithm of claim 1,
wherein the step of determining the modulation current at the operating temperature includes steps of:
calculating a plurality of modulation currents at temperatures different from the low, room, and high temperature based on the exponential function;
storing the plurality of modulation currents in a memory in connection with the temperatures corresponding thereto,
sensing a current temperature, and
reading one of modulation currents stored in the memory whose corresponding temperature is closest to the current temperature.

3. The algorithm of claim 1,
wherein the step of determining the modulation current at the operating temperature includes steps of:
calculating a plurality of modulation currents at temperatures different from the low, room, and high temperatures based on the exponential function;
storing the plurality of modulation currents in a memory in connection with the temperatures corresponding thereto,
sensing a current temperature,
reading at least two modulation currents stored in the memory whose corresponding temperatures putting the current temperature therebetween, and
calculating a modulation current to be provided to the LD by an interpolation of the at least two modulation currents.

4. The algorithm of claim 1,
wherein the exponential function to relate the modulation current with the temperature is given by:

$$I_{mod}=a\times\exp(b\times T)+c,$$

wherein a, b, and c are constant determined by the three modulation currents measured at the low, room, and high temperatures, respectively, wherein the algorithm further includes a step of:
storing the constants, a, b, and c, in a memory before the determination of the modulation current at the operating temperature.

5. The algorithm of claim 4,
wherein the step of determining the modulation current at the operating temperature includes steps of:
sensing a current temperature,
reading the constants, a, b, and c, from the memory, and
determining the modulation current for the current temperature by using the constants, a, b, and c, and the exponential function.

6. A method to drive a semiconductor laser diode (LD) by supplying a bias current and a modulation current, the LD is installed in an optical subassembly (OSA) that implements with the LD and a photodiode to monitor back facet light of the LD, the method comprising steps of:
in a condition where the LD is installed in the OSA but the OSA is not installed in an optical module,
measuring modulation currents at low, room, and high temperatures, each of the modulation currents setting an extinction ratio of front face light of the LD emitted from the OSA in a preset value independent of the temperatures under a condition where the front facet light output from the OSA is kept in an average power thereof in another preset value independent of the temperatures of the OSA by monitoring the back facet light of the LD through the photodiode, and relating the modulation currents with the temperatures by an exponential function;
installing the OSA within the optical module;
measuring a modulation current at one of the low and high temperatures to set an extinction ratio of light emitted from the optical module in the preset value, the light being affected by a tracking error of the optical module;
setting the optical module in an operating temperature between the room temperature and one of the low temperature and the high temperature; and
correcting a modulation current to set the extinction ratio of the light emitted from the optical module in the preset value by a linear interpolation of a difference between the modulation current measured at one of the low and high temperatures and the modulation current calculated by the exponential function for one of the low and high temperatures.

* * * * *